United States Patent
Farroni

(10) Patent No.: US 7,410,091 B2
(45) Date of Patent: *Aug. 12, 2008

(54) METHOD OF INTEGRATED CIRCUIT ASSEMBLY

(75) Inventor: Jean-Paul Farroni, Saint Avertin (FR)

(73) Assignee: STMicroelectronics S.A., Montrouge (FR)

(*) Notice: Subject to any disclaimer, the term of this patent is extended or adjusted under 35 U.S.C. 154(b) by 428 days.

This patent is subject to a terminal disclaimer.

(21) Appl. No.: 10/858,334

(22) Filed: Jun. 1, 2004

(65) Prior Publication Data

US 2004/0217153 A1 Nov. 4, 2004

Related U.S. Application Data

(63) Continuation of application No. 09/845,137, filed on Apr. 30, 2001, now abandoned, which is a continuation of application No. 09/364,529, filed on Jul. 30, 1999, now Pat. No. 6,247,637.

(30) Foreign Application Priority Data

Jul. 30, 1998 (FR) ................................ 98/09946

(51) Int. Cl.
*B23K 31/02* (2006.01)
(52) U.S. Cl. ............... 228/248.1; 228/180.22; 228/234.1
(58) Field of Classification Search ........... 228/248.1, 228/189; 257/737, 738
See application file for complete search history.

(56) References Cited

U.S. PATENT DOCUMENTS

| 3,591,839 | A |  | 7/1971 | Evans et al. | |
|---|---|---|---|---|---|
| 5,251,806 | A |  | 10/1993 | Agarwala et al. | |
| 5,324,569 | A | * | 6/1994 | Nagesh et al. | 428/198 |
| 5,361,973 | A |  | 11/1994 | Ishii et al. | |
| 5,385,290 | A |  | 1/1995 | Degani | |
| 5,425,493 | A |  | 6/1995 | Interrante et al. | |
| 5,667,132 | A |  | 9/1997 | Chirovsky et al. | |
| 5,807,508 | A | * | 9/1998 | Kawahara et al. | 252/512 |
| 5,868,887 | A |  | 2/1999 | Sylvester et al. | |
| 5,872,400 | A | * | 2/1999 | Chapman et al. | 257/738 |
| 5,931,371 | A | * | 8/1999 | Pao et al. | 228/180.22 |
| 6,186,390 | B1 | * | 2/2001 | Tadauchi et al. | 228/56.3 |
| 6,189,771 | B1 | * | 2/2001 | Maeda et al. | 228/248.1 |

(Continued)

FOREIGN PATENT DOCUMENTS

DE 32 08 604 A1 9/1983

(Continued)

OTHER PUBLICATIONS

French Search Report from French Patent Application 98/09946, filed Jul. 30, 1998.

(Continued)

*Primary Examiner*—Kiley Stoner
(74) *Attorney, Agent, or Firm*—Lisa K. Jorgenson; James H. Morris; Wolf, Greenfield & Sacks, P.C.

(57) ABSTRACT

A method of integrated circuit assembly before encapsulation including at least one step of soldering, under mechanical pressure, a first element on a second element, including temporarily maintaining a predetermined spacing, at least partially without solder paste, between the surfaces to be assembled of the first and second elements.

23 Claims, 3 Drawing Sheets

U.S. PATENT DOCUMENTS

| | | | |
|---|---|---|---|
| 6,247,637 B1 | 6/2001 | Farroni | |
| 6,337,445 B1 * | 1/2002 | Abbott et al. | 174/260 |
| 6,386,426 B1 * | 5/2002 | Tadauchi et al. | 228/117 |
| 6,846,375 B2 * | 1/2005 | Hayama et al. | 156/89.16 |
| 6,981,317 B1 * | 1/2006 | Nishida | 29/840 |

FOREIGN PATENT DOCUMENTS

| | | | |
|---|---|---|---|
| FR | 2781924 A1 * | 2/2000 | |
| JP | 408316619 A * | 11/1996 | |
| JP | 409260438 A * | 10/1997 | |
| JP | 410079404 A * | 3/1998 | |

OTHER PUBLICATIONS

Database WPI, Section EI, Week 8918 Derwent Publications Ltd., London, DB; Class U11, AN 89-132345 XP002098196 & FR 2 620 569 A (Radiotechnique Compelec) Mar. 17, 1989.

Patent Abstracts of Japan vol. 006, No. 151 (E-124), Aug. 11, 1982 & JP 57 072357 A (NEC Corp.), May 6, 1982.

* cited by examiner

METHOD OF INTEGRATED CIRCUIT ASSEMBLY

CROSS REFERENCE TO RELATED APPLICATIONS

This application is a continuation of application Ser. No. 09/845,137, filed Apr. 30, 2001 now abandoned, which in turn is a continuation of application Ser. No. 09/364,529, filed Jul. 30, 1999, now U.S. Pat. No. 6,247,637 entitled METHOD OF INTEGRATED CIRCUIT ASSEMBLY, which prior applications are incorporated herein by reference.

BACKGROUND OF THE INVENTION

1. Field of the Invention

The present invention relates to a method of integrated circuit assembly before encapsulation. More specifically, the present invention relates to soldering steps of such a method.

2. Discussion of the Related Art

In a conventional integrated circuit manufacturing method, each chip, resulting from the dicing of a semiconductive wafer on which are formed several chips, must be individually assembled on a heat sink. Each chip may be assembled on a connection grid, itself assembled on a heat sink, the sink and the connection grid being then separated by an isolator, for example, made of ceramic.

Each of the different elements (sink, ceramic, connection grid, chip) must be attached to at least another one of these elements. For this purpose, solderings have to be made between a first and a second element.

FIGS. 1A and 1B illustrate a conventional soldering method. An upper element 11 (for example, a chip) is desired to be attached to a second lower element 12 (for example, a grid) by means of a solder paste 13. Initially, as illustrated in FIG. 1A, first element 11 is laid on solder paste 13. The distance separating the first and second elements 11, 12 thus corresponds to thickness T1 of deposited paste 13, for example, about 40 µm. Such a paste is typically formed of balls 14 of fusible metals such as lead, tin, and silver in various combinations.

In the automatic deposition of the different assembly elements (chip, ceramic, grid), a mechanical pressure is exerted vertically from top to bottom, this pressure being generally high due to the absence of any clearance in the grasping system: the absence of any clearance is compulsory for a good positioning accuracy upon deposition.

This pressure "crushes" the joint before the fusion, the two elements to be soldered being then separated from each other by a minimum distance equal to the maximum diameter of the paste particles, that is, about 40 µm. Another disadvantage of this pressure upon deposition is to expel the paste towards the outside of the surface to be soldered.

Then, paste 13 is brought to the fusion point while exerting, on first element 11, a light mechanical pressure homogeneously distributed on its surface.

FIG. 1B illustrates the assembly obtained by such a method. Conventionally, first and second elements 11, 12 are now only separated by a soldering joint (hard soldering) 16 of a thickness T2, for example, on the order of 15 µm, substantially one third of initial thickness T1 of paste 13.

A disadvantage of this method is linked to the very small final thickness T2, especially as compared to the contact surfaces involved, which are relatively large. Indeed, in the operation at high temperatures and during temperature variations, the heat coefficient difference between the two elements of different nature attached by soldering, combined with the small thickness of the soldering, can cause disconnection of the two elements. Such disconnection results in malfunctions of the circuit in which it occurs.

Thickness T2 of the obtained soldering depends on the thickness T1 of initially deposited solder paste. It has already been provided to increase thickness T1, by increasing the amount of deposited solder paste. But the high pressure during the deposition of the elements expels the paste outside the surface to be soldered, which results in new disadvantages, especially a problem of alignment of the elements, which tend to float.

It should be noted that these problems also arise when a soldering joint is created between a ceramic pad and a connection grid and between this pad and a sink. Indeed, if elements like the connection grid and the sink appear, upon assembly, in the form of strips of linked elements, the chips and ceramic pads are however individualized before this assembly and are thus not held laterally.

SUMMARY OF THE INVENTION

The present invention aims at overcoming the disadvantages of conventional methods.

Especially, the present invention aims at providing a novel method of soldering two integrated circuit elements which results in a strong solder bond, even under high operating temperatures and for large temperature variations.

To achieve these and other objects, the present invention provides controlling the thickness of the soldering joint.

More specifically, the present invention provides a method of integrated circuit assembly before encapsulation including at least one step of soldering, under mechanical pressure, a first element on a second element, including temporarily maintaining a predetermined spacing, at least partially without solder paste, between the surfaces to be assembled of the first and second elements.

According to an embodiment of the present invention, the method includes using a solder paste comprising balls of a diameter greater than the individual diameter of other components of the deposited solder paste, to avoid filling the predetermined spacing defined by the ball diameter.

According to an embodiment of the present invention, the balls have a diameter much greater than the final thickness desired for the soldering.

According to an embodiment of the present invention, the ratio between the balls and the individual diameter of the other components is greater than 5, preferably on the order of 10.

According to an embodiment of the present invention, the balls have a diameter ranging between 0.1 and 0.6 mm, preferably on the order of 0.4 mm.

According to an embodiment of the present invention, the balls of greater diameter are formed of the same alloy as the other components of the solder paste.

According to an embodiment of the present invention, the method comprises the steps of depositing a layer of solder paste on the second element, depositing the balls by means of needles at the tips of which they are maintained before dispensing by solder paste.

According to an embodiment of the present invention, the needle tips are dipped in the solder paste layer, then in a bed of balls before being dipped again in the paste layer where the balls remain by capillarity.

According to an embodiment of the present invention, the first element is a ceramic pad and the second element is a metal heat sink.

According to an embodiment of the present invention, the first element is a heat sink and the second element is a connection grid.

The foregoing objects, features and advantages of the present invention will be discussed in detail in the following non-limiting description of specific embodiments in connection with the accompanying drawings.

DETAILED DESCRIPTION

According to the present invention, the elements to be soldered are temporarily maintained at a predetermined distance from each other. This maintaining of a distance aims, in particular, at enabling the use of greater solder paste volumes without risking misalignment of the elements, even under a high mechanical pressure of deposition of the elements to be soldered.

Figure 1A:
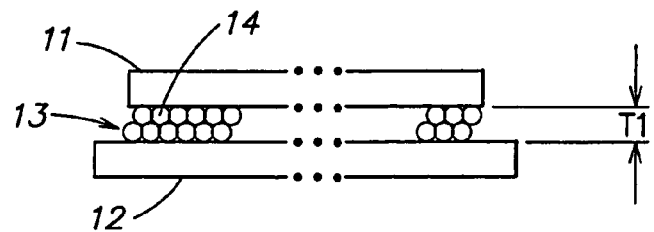
FIGS. 1A and 1B, previously described, are meant to show the state of the art and the problem to solve.
Figure 1B:
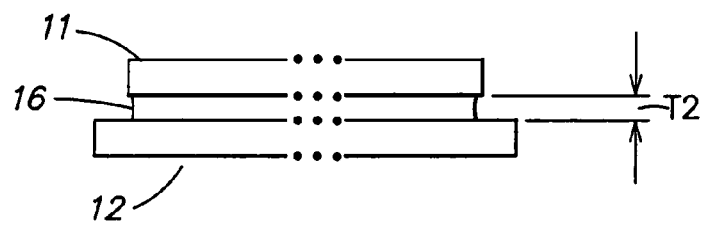
Figure 2A:
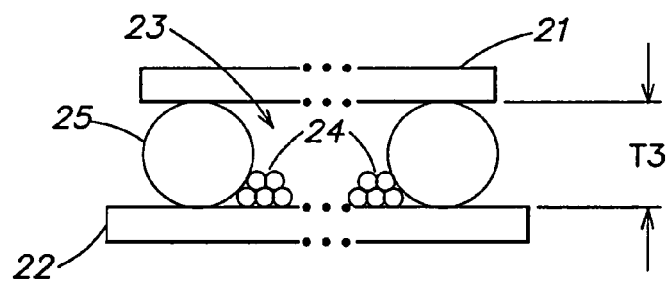
FIGS. 2A and 2B schematically show steps of a method of soldering integrated circuit elements according to an embodiment of the present invention.
Figure 2B:
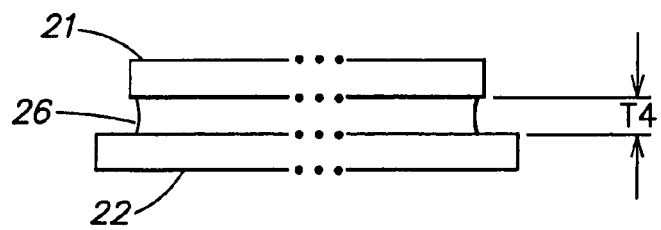

FIGS. 2A and 2B illustrate, in cross-section, respectively before and after the fusion, an embodiment of the present invention.

A soldering of a first element 21 on a second element 22 is desired to be performed by means of a solder paste 23.

According to this embodiment, paste 23 includes balls 25 of a much greater diameter than that of the other elements 24 of the paste, in particular, of other balls forming the bulk of the paste. These balls of greater diameter are formed of the same alloy as the other solder paste balls. They are spherical and calibrated in diameter. The proportion of such balls 25 is significant enough for element 21 to be substantially parallel to element 22. Balls 25 maintain, before the fusion, a spacing T3 between the respective surfaces to be assembled of first and second elements 21 and 22. Spacing T3 which substantially corresponds to the diameter of balls 25 ranges, for example, between 100 and 600 μm and is, preferably, on the order of 400 μm.

It should be noted that spacing T3 is partially without solder paste, that is, the thickness of the deposited paste layer is smaller than the diameter of balls 25. Preferably, the ratio between balls 25 and the diameter of the other paste components is greater than 5, preferably, on the order of 10.

During the fusion, elements 24 of the paste melt before balls 25 of greater diameter which are then used to temporarily maintain spacing T3. When, under the effect of the mechanical pressure and of the melting of balls 25, the latter crush without however being completely liquid, they avoid the "floating" of element 21. The temporary maintaining of spacing T3 has other favorable effects.

First, it is now possible to increase the volume of paste 23 and, accordingly, thickness T4 of soldering joint 26 (FIG. 2B).

Further, when balls 24 have melted, the fact that element 21 does not readily bear against the soldering increases the degassing of the soldering and, accordingly, the strength of the obtained joint 26, by reducing the soldering gaps due to the degassing of the paste and by increasing the thickness of the soldering joint.

FIGS. 3A to 3F illustrate, by partial cross-section views, an alternative embodiment of the soldering method according to the present invention according to which balls 25 are not mixed to the solder paste but are deposited in a layer of paste previously spread on one of the elements.

According to this alternative embodiment, it is desired, as previously, to solder a first element 21 on a second element 22 by means of a solder paste 23 of conventional composition when dispensed.

Figure 3A:
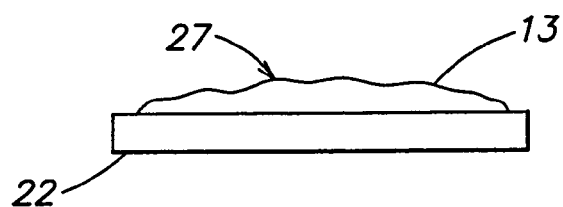
FIGS. 3A to 3F schematically illustrate steps of an alternative embodiment of the method according to the present invention.
Figure 3B:
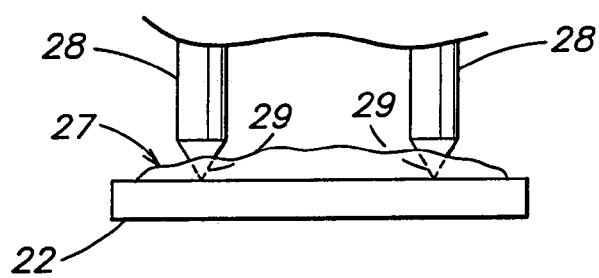
Figure 3C:
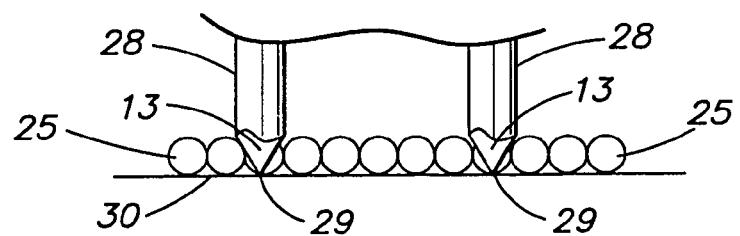

FIG. 3A shows second element 22 on which a layer 27 of conventional solder paste 13 has been conventionally deposited. In FIGS. 3A to 3F, paste 13 has been shown as a layer which is homogeneous, although generally formed of fusible balls of small diameter (for example, smaller than approximately 40 μm). The only distinction at this point with respect to a conventional method is that the thickness of deposited paste is much greater.

In a second step (FIG. 3B), needles 28 of very small diameter (for example, on the order of the diameter of balls 25 to come, or even smaller) are driven into layer 27 so that their respective tips 29 are, once removed from layer 27, coated with solder paste 13. The number (for example, 3 or 4) of needles 28 especially depends on the size (surface) of the elements and their distribution is, of course, adapted to the distribution desired for balls 25.

Balls 25 are taken from a magazine 30 (FIG. 3C), preferably horizontal and comprising a single layer or bed of balls 25. Needles 28, for example, hanging from an automatic handling block (not shown), are displaced altogether and are driven into the ball bed of magazine 30.

Figure 3D:
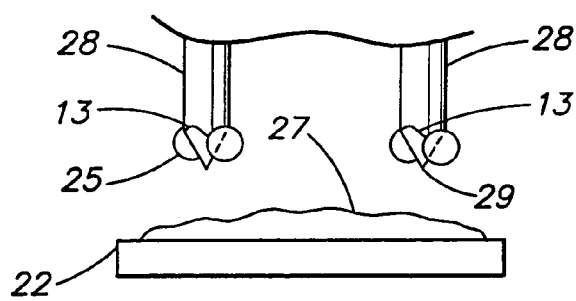

The needles are then raised back and displaced to be placed back above element 22 (FIG. 3D). Each needle then carries a few balls (for example, 3 or more according to the diameter ratio between tips 29 and balls 25) which are "pasted" by capillarity to its tip 29 by paste 13.

Figure 3E:
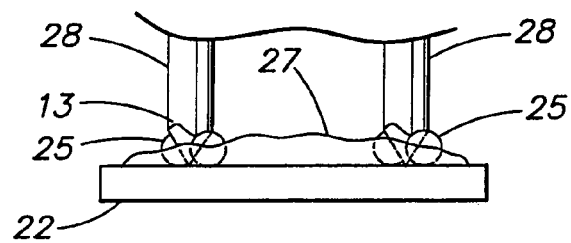
Figure 3F:
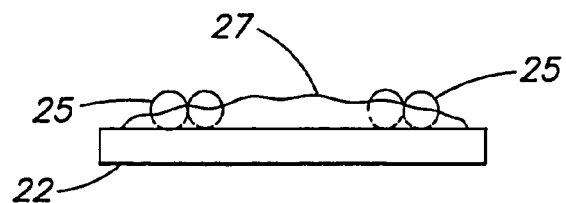

Needles 28 are then driven back into paste layer 27 deposited on element 22 (FIG. 3E). Balls 25 remain therein by capillarity, the volume of paste 13 in which they are now dipped having an adhesion surface greater than that of tips 29 of the needles. The needles can thus be raised back (FIG. 3F) and an original structure to deposit the first element and apply the rest of the method such as described in relation with FIGS. 2A and 2B is obtained.

It should be noted that, differently from systems of solder paste deposition by means of hollow needles, the needles used according to the present invention are not pierced at their tip. An advantage of the alternative of FIGS. 3A to 3F is that it eases the implementation of the present invention, in particular when granulometric differences (for example, 20 to 40 μm for paste 13 and 0.4 mm for balls 25) and the desired proportion of balls (for example, 1 to 3%) make the deposition of a compound paste difficult. In particular, if the dispensing is performed by means of a hollow needle, the internal diameter of the needle must be on the order of seven times the diameter of the biggest particle, which would result, for a premixed paste, diameters (several mm) that are too large.

The present invention has the advantage of providing soldering joints of a predetermined thickness, sufficient to ensure the maintenance of a rigid contact between two elements of an integrated circuit during the operation thereof.

Of course, the present invention is likely to have various alterations, modifications, and improvements which will readily occur to those skilled in the art. In particular, the amount (volume) of solder paste to be deposited between the two elements depends on the final desired thickness for the soldering joint and on the height of the temporary spacing means (balls 25, FIG. 2A), taking account of the reduction coefficient (for example, one third) upon fusion. Similarly, the amount of solder paste to be deposited depends, of course, on the respective surfaces of the elements to be assembled. Further, the realization of tools adapted to implementing the steps of dispensing balls 25 with needles is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of integrated circuit assembly before encapsulation, the method comprising:
   at least one step of soldering under mechanical pressure a first element to a second element with solder paste that includes first solder paste elements and second solder paste elements, including temporarily maintaining a predetermined spacing between the first and second elements with the first solder paste elements to provide a space between the first and second elements that lacks solder paste; and
   heating the solder paste to allow the second element to move closer to the first element and to fill the space with solder paste.

2. The method of claim 1, further comprising:
   depositing a solder paste on at least a first surface of the first element;
   wherein the first solder paste elements comprises balls of a diameter greater than an individual diameter of other components of the solder paste;
   wherein the diameter of the balls defines the predetermined spacing; and
   wherein the balls prevent the filling of the predetermined spacing during the deposition of the solder paste.

3. The method of claim 2, wherein the diameter of each ball is much greater than a final thickness desired for soldering.

4. The method of claim 3, wherein a ratio between the diameter of each ball and the individual diameter of the other components of the solder paste is greater than 5.

5. The method of claim 3, wherein the diameter of each ball ranges between 0.1 and 0.6 mm.

6. The method of claim 2, wherein the balls are formed of a same alloy as the other components of the solder paste.

7. The method of claim 1, further comprising successively performing steps of:
   depositing a layer of solder paste on the second element, and
   depositing balls each of a diameter greater than an individual diameter of other components of the solder paste by means of needles having tips, wherein the balls are maintained before dispense at the needle tips by solder paste.

8. The method of claim 7, wherein the tips of the needles are dipped in the layer of solder paste, then in a bed of balls before being dipped again in the layer of solder paste where the balls remain by capillarity.

9. The method of claim 1, wherein the first element is a ceramic pad and the second element is a metal heat sink.

10. The method of claim 1, wherein the first element is a heat sink and the second element is a connection grid.

11. The method of claim 1, wherein a size of each first solder paste element is greater than a size of each second solder paste element.

12. The method of claim 11, wherein each first solder paste element is a ball, and wherein the size of the first solder paste elements corresponds to a diameter of the ball.

13. The method of claim 12, wherein a ratio between the diameter of a ball and the size of second solder paste elements is greater than 5.

14. The method of claim 12, wherein the diameter of each ball ranges between 0.1 and 0.6 mm.

15. The method of claim 12, wherein the diameter of each ball corresponds to a value of the predetermined spacing.

16. The method of claim 11, further comprising:
   heating the solder paste, thereby at least partially melting the first solder paste elements; and
   wherein the mechanical pressure, in combination with the at least partial melting of the first solder paste elements, acts to crush the first solder paste elements.

17. The method of claim 16, wherein the crushing of the solder paste elements leads to the establishment of a second spacing between the first and second solder paste elements, wherein the second spacing is substantially filled by solder paste.

18. The method of claim 17, wherein the size of each first solder paste elements is greater than the second spacing.

19. The method of claim 4, wherein the ratio of the diameter of each ball and the individual diameter of the other components is approximately 10.

20. The method of claim 5, wherein the diameter of each ball is approximately 0.4 mm.

21. The method of claim 13, wherein the ratio of the diameter of each ball and the size of the second components of the solder paste is approximately 10.

22. The method of claim 14, wherein the diameter of each ball is approximately 0.4 mm.

23. A method of integrated circuit assembly before encapsulation, the method comprising:
   at least one step of soldering under mechanical pressure a first element to a second element with solder paste that includes first solder paste elements and second solder paste elements, each of the first solder paste elements being of greater size than each of the second solder paste elements, including temporarily maintaining a predetermined spacing between the first and second elements with the first solder paste elements to provide a space between the first and second elements that lacks solder paste.

* * * * *